(12) United States Patent
Qin et al.

(10) Patent No.: US 7,939,352 B2
(45) Date of Patent: May 10, 2011

(54) SELECTIVE AREA METAL BONDING SI-BASED LASER

(75) Inventors: Guogang Qin, Beijing (CN); Tao Hong, Beijing (CN); Ting Chen, Beijing (CN); Guangzhao Ran, Beijing (CN); Weixi Chen, Beijing (CN)

(73) Assignee: Peking University, Beijing (CN)

( * ) Notice: Subject to any disclaimer, the term of this patent is extended or adjusted under 35 U.S.C. 154(b) by 37 days.

(21) Appl. No.: 12/539,500

(22) Filed: Aug. 11, 2009

(65) Prior Publication Data
US 2010/0111128 A1    May 6, 2010

(30) Foreign Application Priority Data

Nov. 4, 2008    (CN) .......................... 2008 1 0226036

(51) Int. Cl.
*H01L 21/00* (2006.01)
(52) U.S. Cl. .................................. 438/31; 257/E21.157
(58) Field of Classification Search .................... 438/22, 438/28, 31, 32, 93, 94; 257/E21.138, E21.157, 257/E21.213, E21.217
See application file for complete search history.

(56) References Cited

U.S. PATENT DOCUMENTS

| 2008/0002929 A1 | 1/2008 | Bowers et al. | |
|---|---|---|---|
| 2008/0014669 A1* | 1/2008 | Reshotko et al. | 438/33 |
| 2009/0274411 A1* | 11/2009 | Bar et al. | 385/14 |

OTHER PUBLICATIONS

Chen, T. et al., "Electrically Pumped Room-Temperature Pulsed InGaAsP-Si Hybrid Lasers Based on Metal Bonding," Chin. Phys. Lett., 2009, pp. 064211-1-064211-3, vol. 26, No. 6.
Fang, A., et al., "Electrically Pumped Hybrid AlGaInAs-Silicon Evanescent Laser," Optics Express, Oct. 2, 2006, 8 pages, vol. 14, No. 20.

* cited by examiner

*Primary Examiner* — Brook Kebede
(74) *Attorney, Agent, or Firm* — Seed IP Law Group PLLC

(57) ABSTRACT

A method for fabricating a selective area metal bonding Si-based laser, optically or electrically pumped includes: forming a Si waveguide area and a bonding area in a Silicon-On-Insulator (SOI) wafer, and forming an isolating structure to separate the Si waveguide area from the bonding area; forming a metal multilayer for bonding, which also acts as ohmic contact layer in the laser when the laser is electrically pumped. A compound semiconductor optical gain structure is prepared by epitaxial growth and etched off the substrate. The compound semiconductor optical gain structure is aligned with the Si waveguide area in the SOI wafer and the compound semiconductor optical gain structure is bonded on the SOI wafer. The selective area metal bonding Si-based laser can be used as a light source in optoelectronic integration and Si photonics. The method may provide simple operation, flexibility, low cost, and low requirement for cleanness of manufacturing environments.

7 Claims, 6 Drawing Sheets

US 7,939,352 B2

SELECTIVE AREA METAL BONDING SI-BASED LASER

BACKGROUND

1. Technical Field

The present application relates to a method for fabricating a hybrid silicon (Si)-based photonic device in the field of an optoelectronic integration and Si photonics. In particular, the present application relates to a method for fabricating a selective area metal bonding Si-based laser, optically pumped or electrically pumped.

2. Description of the Related Art

With the development of the microelectronic technology, the requirement for the operational speed and the memory capacity of the computer increases rapidly. The information carrier of the traditional microelectronic technology is based on electrons, which information carriers are limited by low transmission rate, narrow bandwidth and a tendency to be affected by electromagnetic interference as they are being charged. In contrast, the transmission rate of a photon is much higher, and the bandwidth associated with photon transmission is much larger than that of the electron transmission, by several orders. Further, the photonic devices have advantages of high speed of response, large transmission capacity, high storage density, high access speed, and high ability to withstand electromagnetic interference. Therefore, it is desired to combine the photons as the carriers of information and the modern microelectronic technology to obtain Si-based optoelectronic integration and Si photonics.

Though Si-photonics technology has been rapidly developing, such as Si stimulated Raman laser, Si/compound semiconductor nanowire laser, there are no practical electrically pumped Si-based lasers for the Si-based optoelectronic integration and Si photonics.

Recently, a method of direct bonding has been developed, wherein a compound semiconductor laser is bonded on a Si-waveguide structure and thereby the light of the compound semiconductor is coupled to Si waveguide so as to achieve an electrically pumped Si-based laser by means of evanescent wave coupling. However, the method of direct bonding has rigorous requirements for environmental cleanliness and a low yield rate.

BRIEF SUMMARY

Embodiments of the present invention provide a method of fabricating a selective area metal bonding Si-based laser, which may be optically pumped or electrically pumped.

According to an aspect a method for fabricating a selective area metal bonding Si-based laser may be summarized as including:

1) forming a Si waveguide area and a bonding area in the Silicon-On-Insulator (SOI) wafer, and forming an isolating structure between the Si waveguide area and the bonding area. The isolating structure separates the Si waveguide area from the bonding area;

2) forming a metal multilayer for bonding, which also acts as ohmic contact layers when the laser is electrically pumped;

3) preparing a compound semiconductor optical gain structure by an epitaxial method and subsequently removing the substrate;

4) aligning the compound semiconductor optical gain structure with the Si waveguide area in the SOI wafer, and bonding the compound semiconductor optical gain structure on the SOI wafer at the bonding areas so as to form a selective metal bonding Si-based laser.

In a further way, a multilayer film structure of the compound semiconductor optical gain structure on a substrate formed by an epitaxial method is inversely bonded on the SOI wafer in the step 2), followed by removing the substrate and then a hybrid Si-based laser is formed on the SOI wafer using a conventional method to produce semiconductor laser diodes.

The metal multilayer for bonding in the step 2) comprises:

Preferably, an adhesive metal layer made of Cr/Au, with a thickness between 10 and 300 nm.

Preferably, an ohmic contact layer made of AuGeNi, with a thickness between 10 and 300 nm.

Preferably, a low melting-point metal layer made of In, In alloy or, AuSn, with a thickness between 30 nm~1 μm.

Preferably, the bonding area is located spaced away from the Si waveguide on the SOI wafer by a distance of at least 2 μm, a width of the metal multilayer in the bonding area is between 3~300 μm, and a width of the Si waveguide is between 0.1~9 μm.

Preferably, the Si waveguide and the Si isolating wall have the same height which is between 500 nm~1.5 μm.

Preferably, the compound semiconductor optical gain structure is made of IIIV or II-VI compound semiconductors.

According to another aspect, a selective metal bonding Si-based laser may be summarized as including: a Si waveguide area located in the SOI wafer; a bonding area for bonding which is located in the SOI wafer; a compound semiconductor optical gain structure located over the Si waveguide area, defining an evanescent wave coupled interface between the Si waveguide area and the compound semiconductor optical gain structure; and wherein an isolating structure for separating the Si waveguide area from the bonding area is formed between the bonding area and the area where the evanescent wave coupled area (i.e., the light coupled area).

The selective area metal bonding Si-based laser according to the invention may be used as a Si-based light source in Si-based optoelectronic integration and Si photonics. More important, the laser may be manufactured in an integration way. The method of the invention has advantages of, such as simple operation, low cost, flexibility, low requirement for the cleanness of the environment and easy integration. Further, the method may be used to bond a light detector and a light amplifier or others photonics devices to achieve a hybrid Si-based photonic device.

DETAILED DESCRIPTION

Embodiments of the invention will be described in detail by providing an example of bonding an InP optical gain structure on a Silicon-On-Insulator (SOI) wafer to form a selective area metal bonding Si-based laser with reference to FIGS. 1(a)-1(i).

Figure 1A:
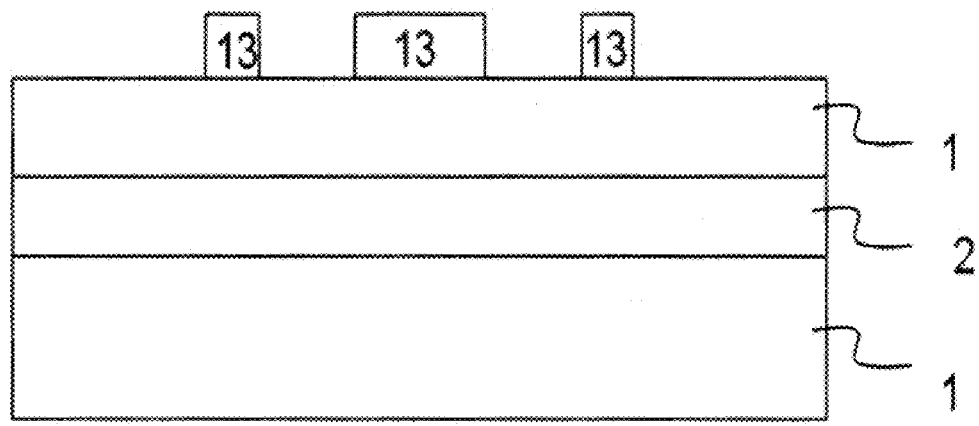
FIGS. 1(a)-1(i) are the flow charts according to a first embodiment of the invention.

1. A layer of photoresist 13 is formed on the SOI wafer by spin coating and photolithography through a mask with periodic features, developed and fixed, as shown in FIG. 1(a).

Figure 1B:
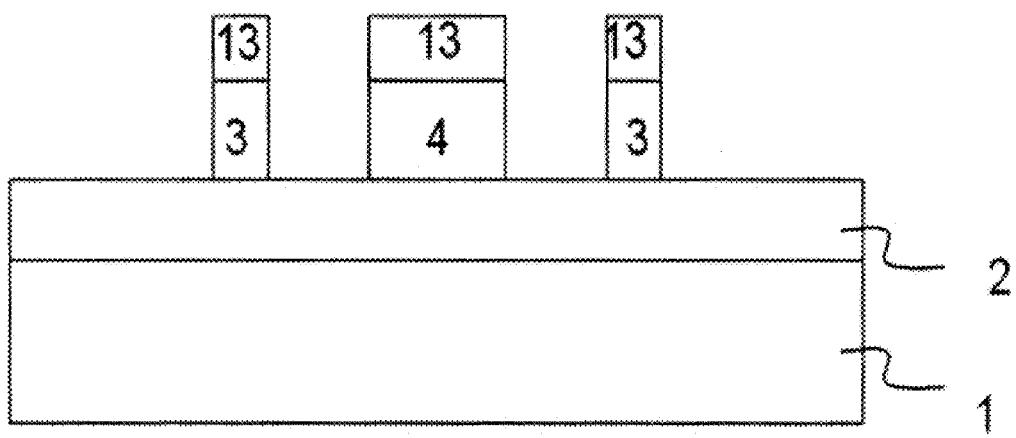

2. The Si 2 uncovered by the photoresist is etched by dry etching such as inductively coupled plasma (ICP) etching or by wet etching to shape a Si waveguide 4, a bonding area 5 and a ridge-like Si isolating wall 3, wherein the Si isolating wall 3 is formed between the Si waveguide 4 and the bonding area 5. The Si isolating wall can be used to prevent metal from flowing toward the Si waveguide 4 during bonding, where a flow of melted metal would otherwise severely affect coupling of light into the Si waveguide 4 from an optical gain area. Further, the Si waveguide 4 and the Si isolating wall 3 have the same height of 800 nm and a width of 3 μm and 1 μm respectively, as shown in FIG. 1(b).

Figure 1C:
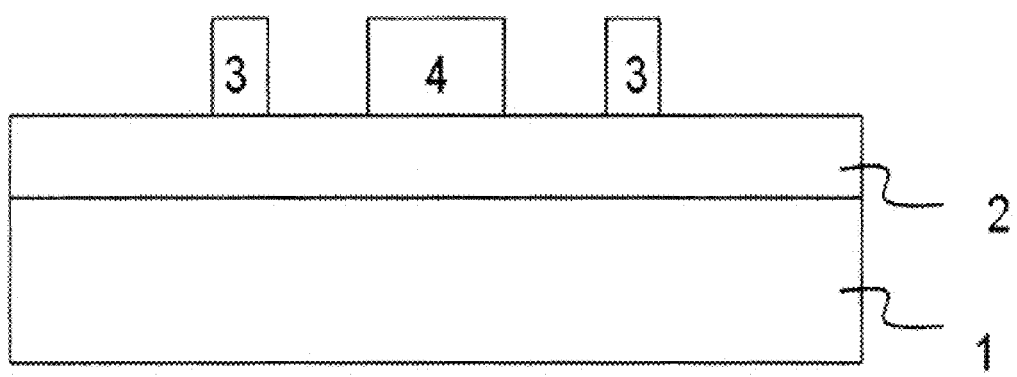

3. The photoresist 13 is removed, as shown in FIG. 1(c).

Figure 1D:
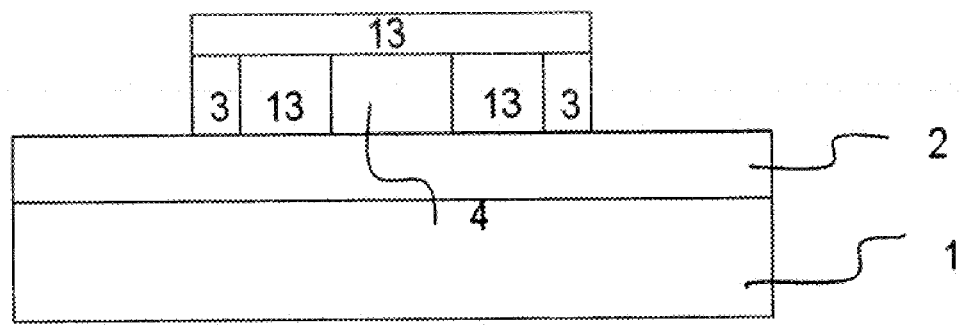

4. The Si waveguide 4 and the Si isolating wall 3 are covered with a photoresist 13 by spin coating and photolithography, as shown in FIG. 1(d).

Figure 1E:
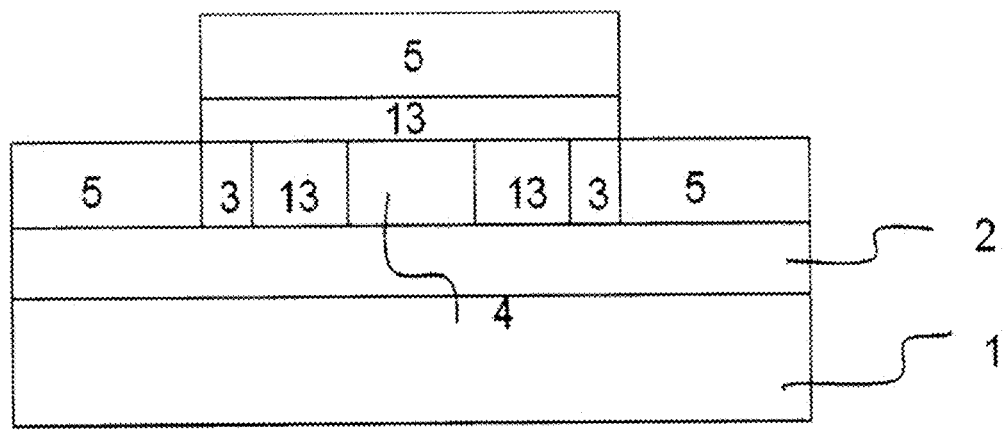

5. A metal layer 5 made of chromium/gold (Cr/Au) (with a thickness of 100 nm) for adhering silicon dioxide ($SiO_2$), an ohmic contact layer made of gold/germanium/nickel (AuGeNi) (with a thickness of 100 nm), and a low melting-point metal layer made of indium (In) (with a thickness of 600 nm), are deposited from the bottom up in turn, as shown in FIG. 1(e).

Figure 1F:
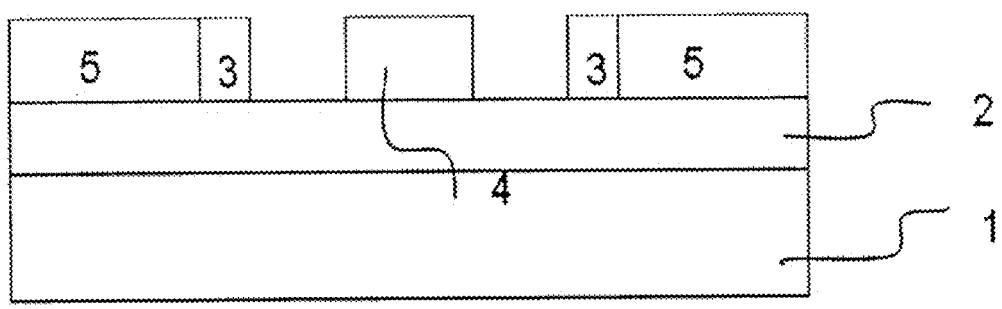

6. The photoresist 13 on the Si waveguide 4 and the Si isolating wall 3, as well as the metal layer 5 on the photoresist 13 are removed by lift off techniques, as shown in FIG. 1(f).

Figure 1G:
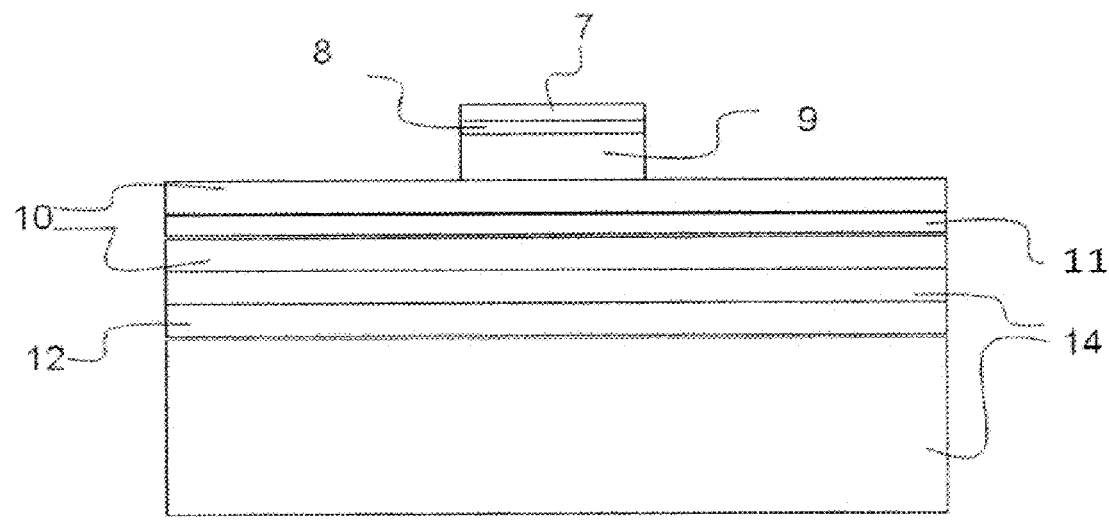

7. An InP based optical gain structure with an etching stop layer is grown by metal organic chemical vapor deposition (MOCVD). That is, etching stop layer 12 made of N-type InGaAsP, N-type InP layer 14, InGaAsP bottom-separate confinement heterojunction (SCH) layer 10, multiple quantum well (MQW) layers 11, upper-SCH layer 10, P-type InP ridge 9, P-type InGaAs layer 8 and Ti/Au electrode layer 7 are grown in turn on the N-type InP substrate 14 with a thickness of about 100 μm, as shown in FIG. 1(g). The above method of fabricating an InP-based laser is well known for those skilled in the art.

Figure 1H:
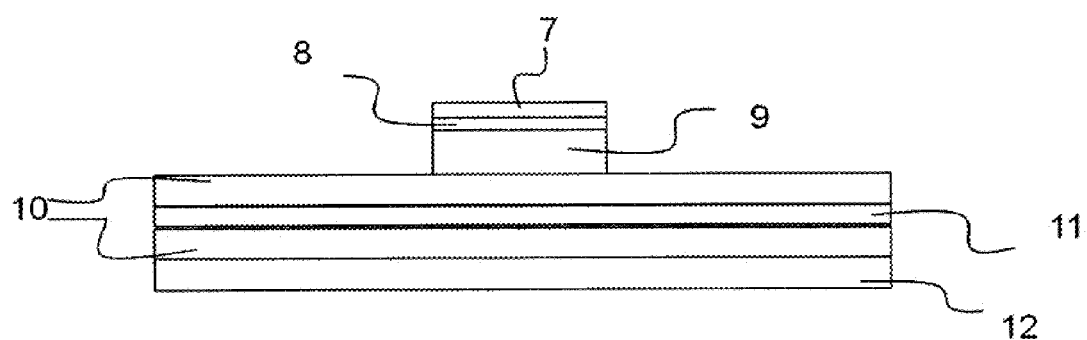

8. The N-type InP substrate 14 of InP-based optical gain structure is thinned by 50 μm by mechanical grind and polish and then the remainder is etched off by chlorhydric acid solution. Subsequently, N-type InGaAsP etching stop layer 12 is etched off using a sulphuric acid solution, as shown in FIG. 1(h).

Figure 1I:
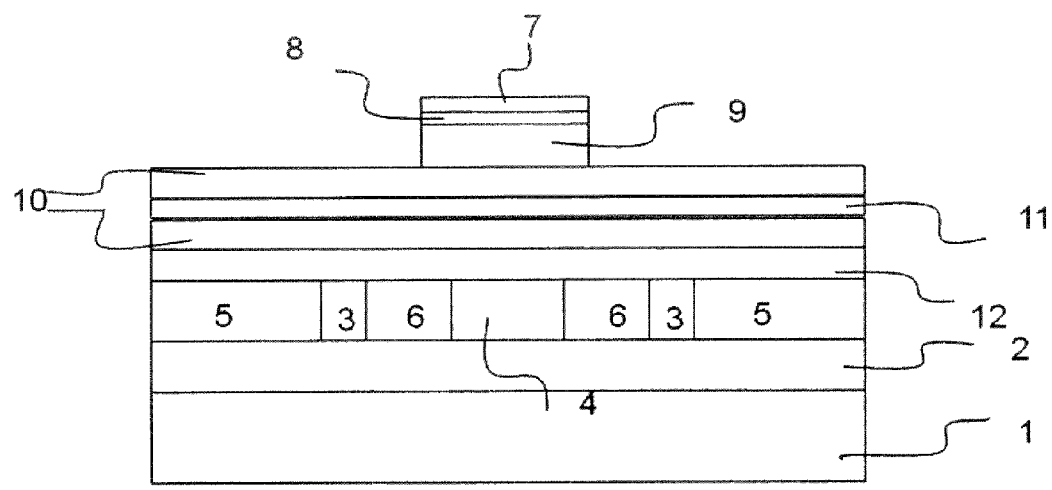

9. The etched InP-based optical gain structure is aligned with the Si waveguide in the SOI wafer by using an apparatus for lithography or bonding or for alignment so as to form a light path from the optical gain structure to the Si waveguide. Then the etched N-type InP optical gain structure is bonded by hot emboss on the SOI wafer. Thus, a selective area metal bonding Si-based laser is produced, as shown in FIG. 1(i).

The selecting of bonding metals is important because the metals not only function as bonding media, but also provide a good ohmic contact to the InP structure with the laser which is electrically pumped. AuGeNi is widely used for a good ohmic contact to the N-type InGaAsP. To avoid destroying or degenerating performance of the laser structure, low bonding temperature is necessary. Metal In is chosen as the main bonding media for a low melting point of 156° C. Thus, the metal bonding can be accomplished at a low temperature (~200° C.). The metals deposition sequence also affects the ohmic contact and bonding strength. Experiments have verified that AuGeNi should be evaporated on the patterned SOI wafer ahead of In. A layer of Sn with a thickness of 20 nm is deposited subsequently to prevent In from being oxidized. The ohmic contact to the InP based laser is less than 4.5 Ohm if the metal evaporation sequence is AuGeNi/In/Sn.

A method for optimizing the preparation of the Si-based InP laser is provided. However, the invention is not limited to this embodiment; corresponding modifications may be made according to the actual requirement and design rules, for example:

Instead of In, the materials of the low melting-point metal layer may be made of PdIn or AuSn.

In addition, the compound semiconductor gain structure according to the invention may also be one of other compound semiconductor gain structures.

Figure 2A:
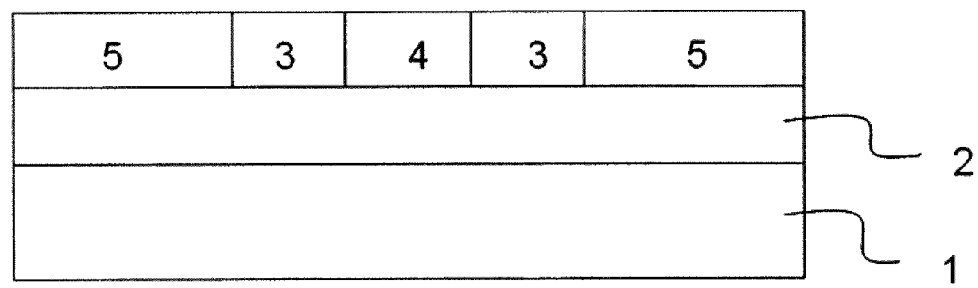
FIGS. 2(a)-2(b) are an embodiment of fabricating the selective area metal bonding hybrid Si-based laser by using benzocyclobutene (BCB) 3 or growing $SiO_2$ to separate a bonding area from a light coupled area.
Figure 2B:
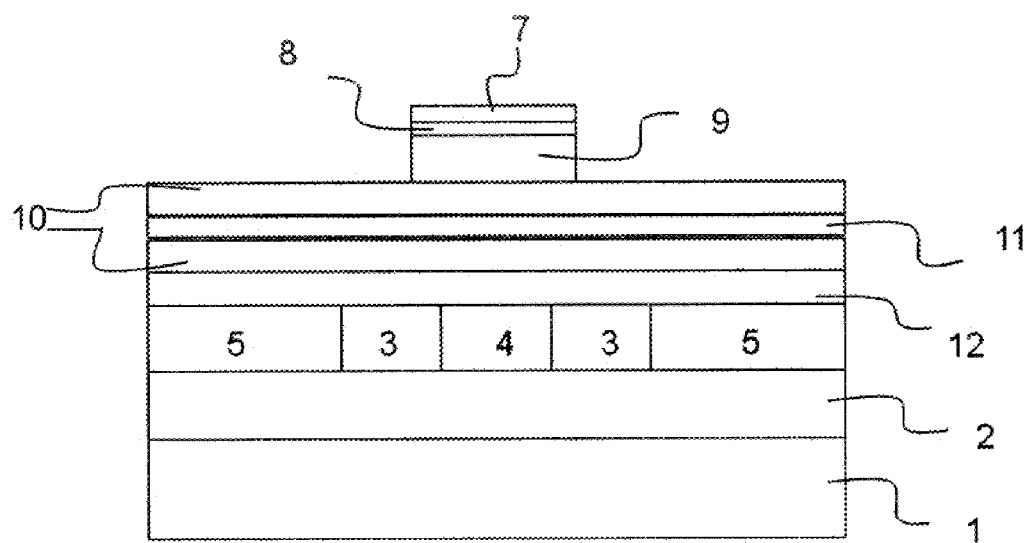

Further, as shown in FIGS. 2(a)-2(b), there are gaps with certain depth which may be formed along both sides of the Si waveguide 4 to separate the bonding area 5 from the light coupled area 4, and which gaps may be filled with material with lower refractive index such as BCB (benzocyclobutene) 3, or $SiO_2$ 3 which optionally has the same height as that of the Si waveguide 4 and functions to separate the bonding area 5 from the light coupled area 3, similar to the Si isolating wall 3 in the aforementioned embodiment. The specific process for bonding the Si waveguide area with the optical gain structure is similar to the aforementioned embodiment.

Figure 3A:
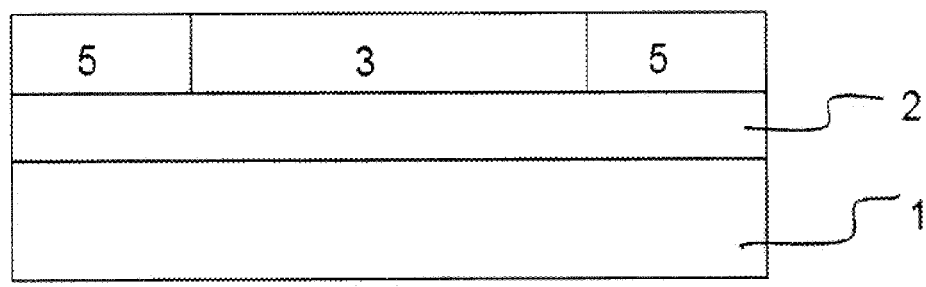
FIGS. 3(a)-3(c) show steps of a third embodiment for fabricating a selective area metal bonding Si-based laser.
Figure 3B:
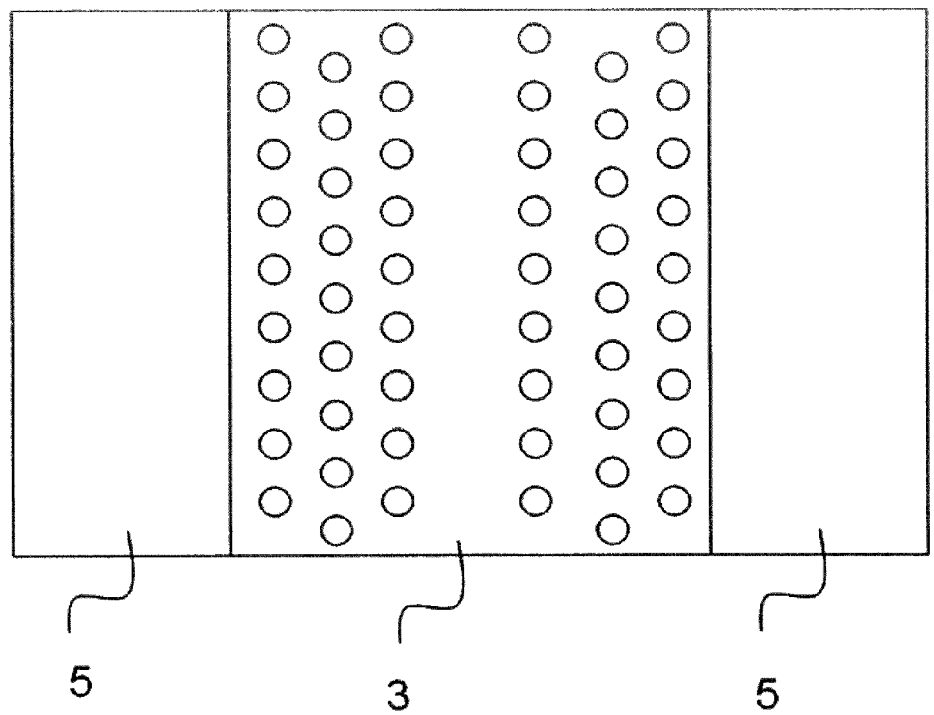
Figure 3C:
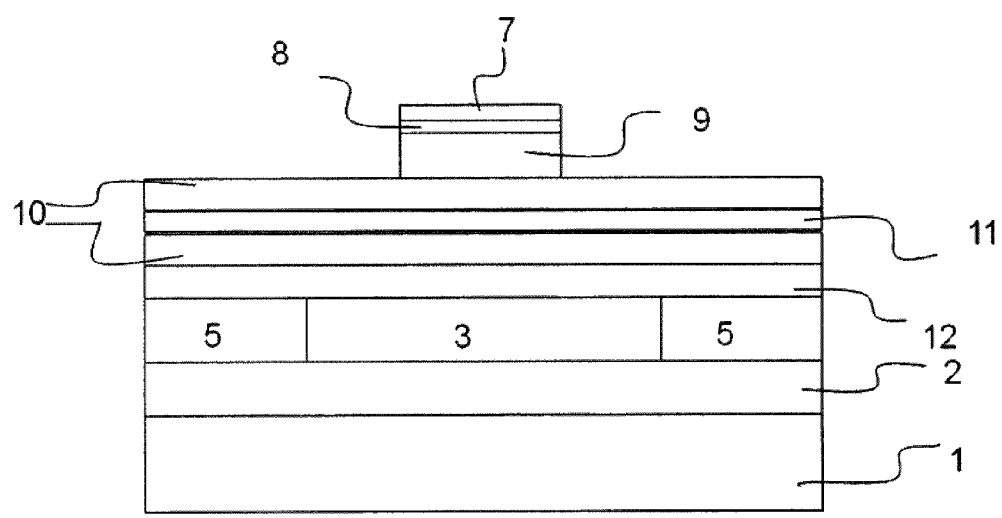

In addition, FIGS. 3(a)-3(c) illustrate a further embodiment. The light coupled area 4 consists of a photonic crystals waveguide. FIG. 3(a) illustrates the SOI wafer before bonding. FIG. 3(b) is the top view of the SOI structure and FIG. 3(c) illustrates the device after bonding.

According to an aspect of the invention, there is provided a metal bonding Si-based photonic device comprising: a Si waveguide area 4 located in the SOI wafer 1; a bonding area 5 for bonding which is located on the Si layer 2 on the insulating substrate 1; a photonic device comprising a compound semiconductor optical gain structure or optical amplification structure or light emitting structure or light detector structure located over the Si waveguide portion, defining an evanescent wave coupled interface between the photonic device and the Si waveguide area; and wherein an isolating structure for isolating the Si waveguide area from the bonding area is formed between the bonding area and the area where the light coupled interface between the photonic device and the Si waveguide area is defined (i.e., the light coupled area).

The isolation structure can optionally be two ridge-like Si isolating walls (or a wall) 3; each has a gap, from the Si waveguide area 4 so as to separate the Si waveguide area 4 from the bonding area 5, as shown in FIGS. 1(a)-1(i). The isolation structure may also be BCB isolating layer 3 extending along each side of the Si waveguide area 4, which is formed by filling the gap etched along both sides of the Si waveguide area 4 with BCB, as shown in FIG. 2. The isolating structure may also be $SiO_2$ layer 3 which extends along both sides of the Si waveguide area 4 so as to separate the Si waveguide area 4 from the bonding area 5, and which is formed by filling gaps etched along both sides of the Si waveguide area 4 with $SiO_2$, as shown in FIGS. 2(a)-2(b). BCB is known for those skilled in the art and can be obtained easily. Further, the growth of $SiO_2$ is also known for those skilled in the art.

According to an aspect of the invention, the compound semiconductor optical gain structure may be multilayer quantum well InP-based gain structure, as known to those skilled in the art.

According to an aspect of the invention, the bonding area is formed by depositing a metal multilayer preferably comprising Cr/Au with a thickness between 10 nm and 300 nm, AuGeNi with a thickness between 10 nm and 300 nm and the low melting-point layer of In, In alloy or AuSn with a thickness between 30 nm and 1 μm.

Methods for fabricating a metal bonding Si-based laser according to the present invention have been described in detail above. However, it will be apparent for those skilled in the art that modifications and changes of the invention may be made without departing from the scopes of the invention; and the methods are not limited to the disclosure in the embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A method for fabricating a selective area metal bonding Si-based laser, comprising:
    forming a silicon (Si) waveguide area and a bonding area for bonding in a Silicon-On-Insulator (SOI) wafer, and forming an isolating structure to separate the Si waveguide area from the bonding area;
    forming a metal multilayer for bonding in the bonding area;
    bonding a compound semiconductor optical gain structure onto the SOI wafer at the bonding area such that the optical gain structure is evanescent wave coupled to the Si waveguide area of the SOI wafer.

2. A method according to claim 1 wherein the forming the isolation structure comprises: etching two grooves along respective sides of the Si waveguide area on the SOI wafer so as to form a pair of ridge-like Si isolating walls that separate the Si waveguide area from the bonding area.

3. A method according to claim 1 wherein the metal multilayer also acts as an ohmic contact layer when the laser is electrically pumped.

4. A method according to claim 3 wherein forming the metal multilayer includes forming a chromium/gold (Cr/Au) layer with a thickness between 10 nm and 300 nm, a gold/germanium/nickel (AuGeNi) layer with a thickness between 10 nm and 300 nm, and a low melting point indium (In) alloy layer with a thickness between 30 nm and 1 μm.

5. A method according to claim 2 wherein the bonding area is spaced from the Si waveguide area by a distance of at least 2 μm, and in the bonding area the metal multilayer has a width between 3 μm and 300 μm and the Si waveguide in the Si waveguide area has a width between 0.1 μm and 10 μm.

6. A method according to claim 1 wherein the compound semiconductor optical gain structure is any one of the III-V and II-VI compound semiconductor optical gain structures.

7. A method according to claim 2 wherein the Si isolating structures may be two ridges which separate the metal multilayers from the Si waveguide.

* * * * *